United States Patent
Chen et al.

(10) Patent No.: US 12,489,002 B2
(45) Date of Patent: Dec. 2, 2025

(54) ANNEALING APPARATUS AND METHOD OF OPERATING THE SAME

(71) Applicant: TAIWAN SEMICONDUCTOR MANUFACTURING COMPANY LTD., Hsinchu (TW)

(72) Inventors: Yi-Fan Chen, New Taipei (TW); Sen-Hong Syue, Hsinchu County (TW); Huicheng Chang, Tainan (TW); Yee-Chia Yeo, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 310 days.

(21) Appl. No.: 17/461,836

(22) Filed: Aug. 30, 2021

(65) Prior Publication Data
US 2023/0060692 A1 Mar. 2, 2023

(51) Int. Cl.
*H01L 21/67* (2006.01)
*H01L 21/324* (2006.01)
*H01L 21/677* (2006.01)

(52) U.S. Cl.
CPC ...... *H01L 21/67109* (2013.01); *H01L 21/324* (2013.01); *H01L 21/67248* (2013.01); *H01L 21/67703* (2013.01)

(58) Field of Classification Search
CPC ............ H01L 21/67109; H01L 21/324; H01L 21/67248; H01L 21/67017; H01L 21/67253; C23C 16/45517
See application file for complete search history.

(56) References Cited

U.S. PATENT DOCUMENTS

| | | | | |
|---|---|---|---|---|
| 6,403,927 B1 * | 6/2002 | Kato | ................. | H01L 21/67109 |
| | | | | 118/724 |
| 7,432,475 B2 * | 10/2008 | Nakajima | ........... | F27B 17/0025 |
| | | | | 118/724 |
| 7,537,448 B2 * | 5/2009 | Saito | ................. | H01L 21/67109 |
| | | | | 219/390 |
| 11,043,402 B2 * | 6/2021 | Kosugi | .................... | F27D 9/00 |
| 11,530,876 B2 * | 12/2022 | Verbaas | ............ | H01L 21/67757 |
| 2007/0187386 A1 | 8/2007 | Kim et al. | | |
| 2012/0244684 A1 * | 9/2012 | Suzuki | .................... | C30B 25/10 |
| | | | | 118/724 |
| 2023/0060692 A1 * | 3/2023 | Chen | ................. | H01L 21/67253 |

FOREIGN PATENT DOCUMENTS

KR   10-0766303   * 10/2007   ....... H01L 21/67017

* cited by examiner

*Primary Examiner* — Mary A Wilczewski
(74) *Attorney, Agent, or Firm* — WPAT LAW; Anthony King (57) ABSTRACT

A method includes: transporting a wafer to an apparatus, the apparatus including: a first chamber configured to receive the wafer and a first gas; a second chamber surrounding the first chamber and configured to receive a second gas; a plurality of gas inlets on a chamber wall of the second chamber; and a plurality of gas vents on the chamber wall of the second chamber; heating the first chamber while keeping a gas pressure difference between the first chamber and the second chamber within a tolerance limit; and cooling the first chamber by exchanging the second gas in the second chamber while keeping the gas pressure difference within the tolerance limit.

20 Claims, 7 Drawing Sheets

ANNEALING APPARATUS AND METHOD OF OPERATING THE SAME

BACKGROUND

Semiconductor manufacturing equipment is essential in manufacturing modern semiconductor devices. Technological advances in structures and functionalities of the semiconductor equipment have produced generations of semiconductor devices, in which each generation includes smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased complexity of processing and manufacturing semiconductor devices. Therefore, there is a continuous need to improve equipment performance in order to improve device robustness as well as reducing manufacturing cost and processing time. Among the various studies of the equipment, the annealing or thermal tools have attracted a great deal of attentions for their prevalent applications in the semiconductor fabrication processes, e.g., ion implantation, damage repairing and oxidation.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Embodiments of the present disclosure discuss an annealing apparatus and an operation method of the annealing apparatus, specifically an annealing apparatus for performing annealing under high-temperature and high-pressure conditions. In some embodiments, the annealing apparatus includes a dual-chamber structure, in which the inner chamber receives a process gas for performing a fabrication step while the outer chamber receives a buffer gas for reducing risk of leakage of the process gas. The outer chamber includes more than one gas inlets and more than one gas vents that can be independently controlled. During a cooling stage of the annealing operation, new buffer gas with relatively low temperatures is introduced to the outer chamber in place of the heated buffer gas for expediting heat exhaustion during the cooling stage. In addition, each of the gas inlets and gas vents is individually controlled to adjust the gas exchange rates in different zones of the outer chamber such that the rates or slopes of temperature decreases in the zones of the inner chamber can be made substantially equal during the cooling stage. As a result, uniform or quasi-uniform annealing performance across different zones of the inner chamber can be achieved.

Figure 1:
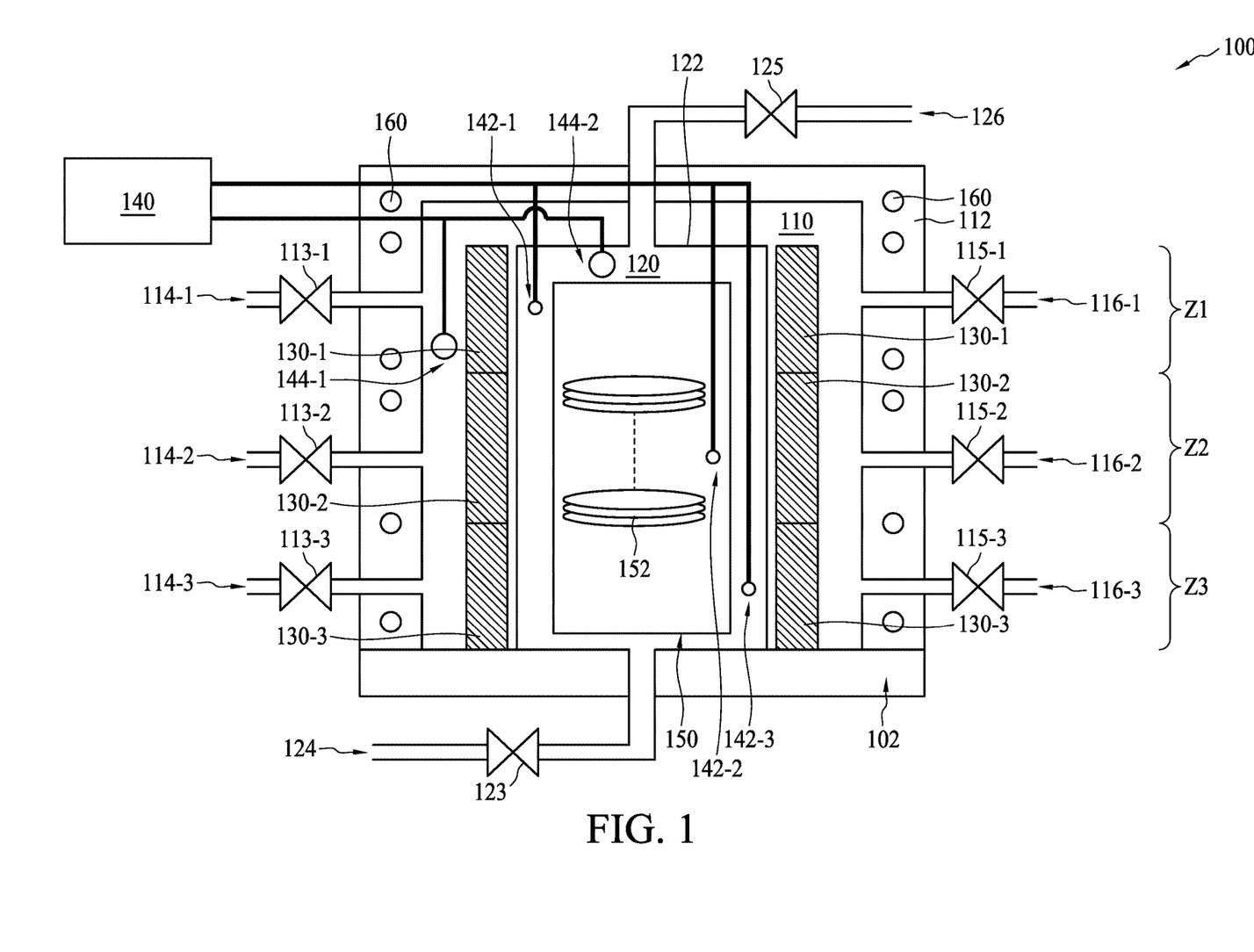
FIG. 1 is a schematic diagram of an annealing apparatus, in accordance with some embodiments of the present disclosure.

FIG. 1 is a schematic diagram of an annealing apparatus 100, in accordance with some embodiments of the present disclosure. In some embodiments, the annealing apparatus 100 is used for performing various semiconductor fabrication steps, e.g., ion implantation, oxide formation, repairing of crystalline defects, and passivation of layers or interfaces, and the like, at an operating temperature between about 150° C. and 1100° C. In some embodiments, the annealing apparatus 100 is operated under a gas pressure in a range between about 0 psi and about 600 psi in terms of gauge pressure. Referring to FIG. 1, the annealing apparatus 100 includes an outer chamber wall 112, a bottom plate 102 and an inner chamber wall 122. The outer chamber wall 112 and the bottom plate 102 define the interior of the annealing apparatus 100 and include a dual-chamber structure. The space defined by the inner chamber wall 122 is referred to herein as an inner chamber 120 while the space between the outer chamber wall 112 and the inner chamber wall 122 is referred to herein as an outer chamber 110.

In some embodiments, the inner chamber 120 is configured as a processing chamber for performing a semiconductor fabrication step through annealing. In an initiation stage of the semiconductor fabrication step, a wafer holder 150, or a wafer boat that carries one or more substrates 152, which may be semiconductor wafers, to be processed may be transported into the inner chamber 120. In some embodiments, a chamber door (not shown) at the bottom plate 102 may be opened to allow entry of the wafer holder 150. The inner chamber wall 122 may have a cylindrical shape. The inner chamber wall 122 may be formed of quartz. In some embodiments, the wafer holder 150 is arranged upright in the inner chamber 120, and the wafers 152 to be processed are held in a stack and parallel to a bottom surface or a top surface of the annealing apparatus 100. Therefore, the wafers 152 to be processed may be positioned at different heights of the inner chamber 120.

The annealing apparatus 100 further includes a gas inlet 124 and a gas vent 126 connected to the inner chamber 120. Each of the gas inlet 124 or the gas vent 126 may include a conduit arranged in fluid communication with the inner chamber 120 and configured to allow gas to flow into or out of the inner chamber 120. In some embodiments, at least one gas, e.g., one or more process gases or carrier gases are introduced into the inner chamber 120 before the annealing operation begins. The at least one gas may be vented through the gas vent 126 after the annealing operation is completed. In the depicted example, the annealing apparatus 100 includes only one gas inlet 124 and only one gas vent 126. However, the present disclosure is not limited thereto, and other numbers of the gas inlet 124 or gas vent 126 are also within the contemplated scoped of the present disclosure.

In some embodiments, the annealing apparatus 100 also includes gas valves 123, 125, or simply valves, connected to the gas inlet 124 and the gas vent 126, respectively. In some embodiments, although not shown, the annealing apparatus 100 further includes mass flow controllers (MFCs) connected to the valves 123, 125 and configured to control the gas to flow from the gas inlet 124 and out of the gas vent 126. In this way, a predetermined gas pressure P2 of the inner chamber 120 can be maintained during the annealing operation. In some embodiments, when the annealing operation is performed under a high-pressure condition, the gas pressure P2 of the inner chamber 120 is maintained in a range between about 0 psi and about 600 psi in terms of gauge pressure.

In some embodiments, the outer chamber 110 is configured as a protection or buffer chamber during an annealing operation. The outer chamber wall 112 may have a cylindrical shape. The outer chamber wall 112 and the bottom plate 102 may be formed of rigid metallic materials, such as stainless steel. The outer chamber wall 112 may have a thickness of between about 5 cm and about 10 cm for sustaining a high gas pressure of the outer chamber 110. The annealing apparatus 100 further includes a plurality of gas inlets 114, e.g., gas inlets 114-1, 114-2, 114-3, and a plurality of gas vents 116 e.g., gas vents 116-1, 116-2, 116-3, all of which are connected to the outer chamber 110. Each of the gas inlets 114 or the gas vents 116 may include a conduit arranged in fluid communication with the outer chamber 110 and configured to allow a gas to flow into or out of the outer chamber 110.

In some embodiments, the gas inlets 114 and the gas vents 116 are arranged on opposite sides of the outer chamber wall 112. In some embodiments, each pair of gas inlet 114-1 and gas vent 116-1 (same for other pairs of gas inlet/vent 114-2/116-2 or 114-3/116-3) are arranged on opposite sides of the outer chamber wall 112 while each pair of inlet/vent (e.g., 114-1/116-1) is overlapped or staggered with another pair of gas inlet/vent (e.g., 114-2/116-2) when viewed from above. In some embodiments, a pair of gas inlet 114-1 and gas vent 116-1 (same for other pairs of gas inlet/vent 114-2/116-2 or 114-3/116-3) are arranged at a same level of the outer chamber wall 112. In some embodiments, at least one gas, e.g., one or more buffer gases are introduced into the outer chamber 110 before the annealing operation begins. The at least one buffer gas may be vented through the gas vents 116 after the annealing operation is completed. In the depicted example, the annealing apparatus 100 only shows three gas inlets 114 and three gas vents 116. However, the present disclosure is not limited thereto, and other numbers of the gas inlets 114 or gas vents 116 more than one and other than three are also within the contemplated scoped of the present disclosure.

In some embodiments, the gas species used for the process gas in the inner chamber 120 includes hydrogen gas or deuterium gas. In some other embodiments, the gas species used for the process gas includes $F_2$, $NH_3$, $Cl_2$, or the like. In some embodiments, the gas species used for the buffer gas in the outer chamber 110 is different from that used in the inner chamber 120, and may include thermal conductive gas, such as inert gas, e.g., nitrogen, helium and argon.

In some embodiments, the annealing apparatus 100 also includes gas valves or simply valves 113, 115, e.g., gas valves 113-1, 113-2, 113-3, 115-1, 115-2, 115-3, connected to the respective gas inlets 114 and the gas vents 116. In some embodiments, although not shown, the annealing apparatus 100 further includes MFCs connected to the corresponding gas inlets 114 and the gas vents 116 and configured to control the gas valves 113, 115. In this way, a predetermined gas pressure P1 of the outer chamber 110 can be maintained.

In some embodiments, the annealing apparatus 100 further includes cooling channels 160 arranged within the outer chamber wall 112. The cooling channel 160 may include fluid conduits extending along the interior of the outer chamber wall 112 and allow thermal conductive fluid, e.g., water or gas, to flow from an inlet (not shown), through the inside of the outer chamber wall 112, and toward an outlet (not shown) to convey heat, e.g., generated during a cooling stage of the annealing operation. In some embodiments, heat transfer from the inner chamber 120 to the external environment is expedited through heat convection of the fluid in the cooling channels 160 and heat conduction through the outer chamber wall 112. As a result, the cooling time can be effectively reduced.

In some embodiments, the annealing apparatus 100 further includes a heater 130 in the outer chamber 110. The heater 130 is used for heating the inner chamber 120 during an annealing operation such that a semiconductor fabrication step can be performed at a higher temperature, e.g., between about 150° C. and about 1100° C. The heater 130 may be arranged surrounding the inner chamber 120. In some embodiments, the heater 130 may be arranged on the inner chamber wall 122. In some embodiments, the heater 130 includes plurality of heating elements 130-1, 130-2 and 130-3. The heating elements 130 may include metallic materials, ceramic materials, or semiconductor materials used for transforming electricity into heat. In some embodiments, the heating elements 130 may have a circular shape when viewed from above to laterally surround the inner chamber 120. In the depicted example, only three heating elements 130 are illustrated. However, the present disclosure is not limited thereto, and other numbers of the heating elements 130 more than one are also within the contemplated scoped of the present disclosure.

In some embodiments, the annealing apparatus 100 further includes a plurality of temperature sensors 142 in the inner chamber 120 for monitoring temperatures in difference locations. The temperature sensors 142, which include temperature sensors 142-1, 142-2, 142-3, may be arranged at different heights of the inner chamber 120. The temperature sensors 142 may include different types, e.g., thermocouples, resistance temperature detector (RTD), thermistors, and semiconductor-based temperature sensors. In the depicted example, only three temperature sensors 142 are illustrated. However, the present disclosure is not limited thereto, and other numbers of the temperature sensors 142 more than one are also within the contemplated scoped of the present disclosure.

In some embodiments, the annealing apparatus 100 further includes a plurality of gas pressure sensors 144 in the outer chamber 110 or the inner chamber 120 for monitor gas pressures P2 or P1 of the outer chamber 110 or the inner chamber 120, respectively. The gas pressure sensors 144 may include a gas pressure sensor 144-1 arranged in the outer chamber 110 and a gas pressure sensor 144-2 arranged in the inner chamber 120. The gas pressure sensor 144 may include different types, e.g., resistive type, capacitive type, or inductive type. In the depicted example, only two gas pressure sensors 144 are illustrated. However, the present disclosure is not limited thereto, and other numbers of the gas pressure sensors 144 arranged in the outer chamber 110 or the inner chamber 120 are also within the contemplated scoped of the present disclosure.

In some embodiments, the outer chamber 110 or the inner chamber 120 is partitioned into more than one virtual zones Z1, Z2, Z3 along the height of the outer chamber 110 or the inner chamber 120. The virtual zones Z1-Z3 are arranged over one another vertically, in which each zone Z1-Z3 is associated with an adjustment set, in which each adjustment set includes a heating element 130, a gas inlet 114 and a gas vent 116, all of which are disposed within the respective zone Z1-Z3. In some embodiments, each heating element 130 is aligned with the corresponding gas inlet 114 or the gas vent 116 of the respective adjustment set. In some embodiments, all of the heating elements 130 are turned on and off at the same time; in some other embodiments, each of the heating elements 130 is individually turned on and off to perform zone-specific temperature control in each zone Z1-Z3. Similarly, in some embodiments, all of the gas inlets 114 or gas vents 116 are turned on/off or tuned at the same time; in some other embodiments, each of the gas inlets 114 or gas vents 116 is individually turned on/off or tuned to perform zone-specific control of the temperature and gas pressures in each zone Z1-Z3. In some embodiments, the heating elements 130-1, 130-2, and 130-3 are arranged at different heights of the outer chamber 110. In some embodiments, the gas inlets 114-1, 114-2, and 114-3 are arranged at different heights of the outer chamber wall 112. In some embodiments, the gas vents 116-1, 116-2, and 116-3 are arranged at different heights of the outer chamber wall 112.

In some embodiments, the annealing apparatus 100 further includes a controller 140 configured to monitor the temperature and gas pressure readings of the temperature sensors 142 and the gas pressure sensors 144. The controller 140 may be further configured to control activation (turning on) and deactivation (turning off) of the heating elements 130 and tuning of the gas inlets 114, 124 and the gas vents 116, 126. In some embodiments, the controller 140 is configured to control operations of the gas valves 113, 123, 115, 125 or the MFCs connected thereto to thereby tune the gas exchange rates, i.e., the amounts of gases flowing into and out of the outer chamber 110 and the inner chamber 120.

In some embodiments, the controller 140 is constructed as a component of the annealing apparatus 100. In some other embodiments, the controller 140 is a standalone device disposed external to the annealing apparatus 100 and electrically connected to the annealing apparatus 100 through wired or wireless connections. The controller 140 can be implemented by, for example, a central processing unit (CPU), a microcontroller, an application-specific integrated circuit ("ASIC"), a field programmable gate array ("FPGA"), a digital signal processor ("DSP"), a network processor, or the like. In some embodiments, the controller 140 is electrically connected to the temperature sensors 142 or the gas pressure sensors 144 to collect temperature or gas pressure readings in real-time. In some embodiments, the connections between the controller 140 and sensors e.g., the temperature sensors 142 and the gas pressure sensors 144, or the valves 113, 123, 115, 125 are implemented by wires or in a wireless manner.

The high gas pressure annealing operation is a promising technique, through which the reaction of the process gas in the inner chamber 120 can be facilitated to thereby reduce the required processing time under the same processing temperature. However, under such high-temperature condition, the highly reactive process gas may introduce safety concern of gas leakage from the inner chamber wall 122. The likelihood of leakage will further increase under the high gas pressure conditions. As a result, if the process gas of a high concentration in the inner chamber 120 is exposed to oxygen in the atmosphere, it can ignite fire or explode. In addition, the inner chamber wall 122 is usually formed of non-metallic materials, e.g., quartz, which may not provide greater support of safety protection. To resolve the aforesaid safety concern of the high-pressure inner chamber 120 and to prevent the process gas from leaking, the outer chamber 110 is used as a buffer chamber between the inner chamber 120 and the atmosphere, in which the buffer gas of the outer chamber 110, e.g., inert gas, is less reactive than the process gas. If the process gas leaks out of the inner chamber 120, the inert gas in the outer chamber 110 serves to diluting the potentially dangerous process gas leaked from the inner chamber 120 and preventing the process gas from leaking directly into the environment.

In some embodiments, to further ensure prevention of the process gas from leaking, the gas pressure P1 of the outer chamber 110 is set higher than the gas pressure P2 of the inner chamber 120 by a positive gas pressure difference Pd=P1−P2, i.e., Pd>0. Accordingly, when leakage occurs on the inner chamber wall 122 or portions of the gas inlet 124 and the gas vent 126 within the outer chamber 110, the gas pressure difference Pd between the outer chamber 110 and the inner chamber 120 will prevent the leaked gas from flowing outwardly. The safety concern can be reduced a step further due to the positive gas pressure difference Pd.

Although the positive gas pressure difference Pd can improve safety of the annealing operation, the gas pressure difference Pd is generally below a tolerance level such that the inner chamber wall 122 will not be damaged due to a high level of the pressure difference Pd. In some embodiments, the gas pressure difference Pd is greater than zero and lower than about 2 atm, lower than about 1 atm or lower than about 0.5 atm. In other words, when any one of the gas pressures P2 and P1 is tuned, the other should also be tuned at the same time so as to maintain the gas pressure difference Pd within the tolerance level.

As discussed previously, the cooling channels 160 of the outer chamber 110 may aid in reducing the cooling time of the inner chamber 120 during the cooling stage of the annealing operation. Due to the structure characteristics of the annealing apparatus 100, the cooling times of the inner chamber 120 may be non-uniform in different zones. In some embodiments, a higher zone, e.g., zone Z1, has a longer cooling time than that of a lower zone, e.g., zone Z3, even with help of the cooling channels 160. That may be due to the fact that the cooling effect of the cooling channels 160 is non-uniform across different zones Z1-Z3 of the inner chamber 120. As a result, the wafers 152 disposed at different heights (i.e., in different zones) of the inner chamber 120 may experience different thermal budgets during the same annealing operation, thereby resulting in performance non-uniformity across different zones. In addition, the cooling performance of the cooling channels 160 alone may not be adequate since the thickness of the outer chamber wall 112 hinders heat from dissipating rapidly out of the outer chamber 110.

According to some embodiments of a control mechanism discussed in the present disclosure, the temperature decreases of the zones Z1-Z3 are controlled individually through the associated adjustment sets in the zones Z1-Z3. The rates or slopes of temperature decrease can be made equal or substantially equal, such that the wafers 152 in different heights or zones can experience substantially equal cooling times and substantially equal thermal budgets while the overall cooling time can be effectively reduced.

Figure 2:
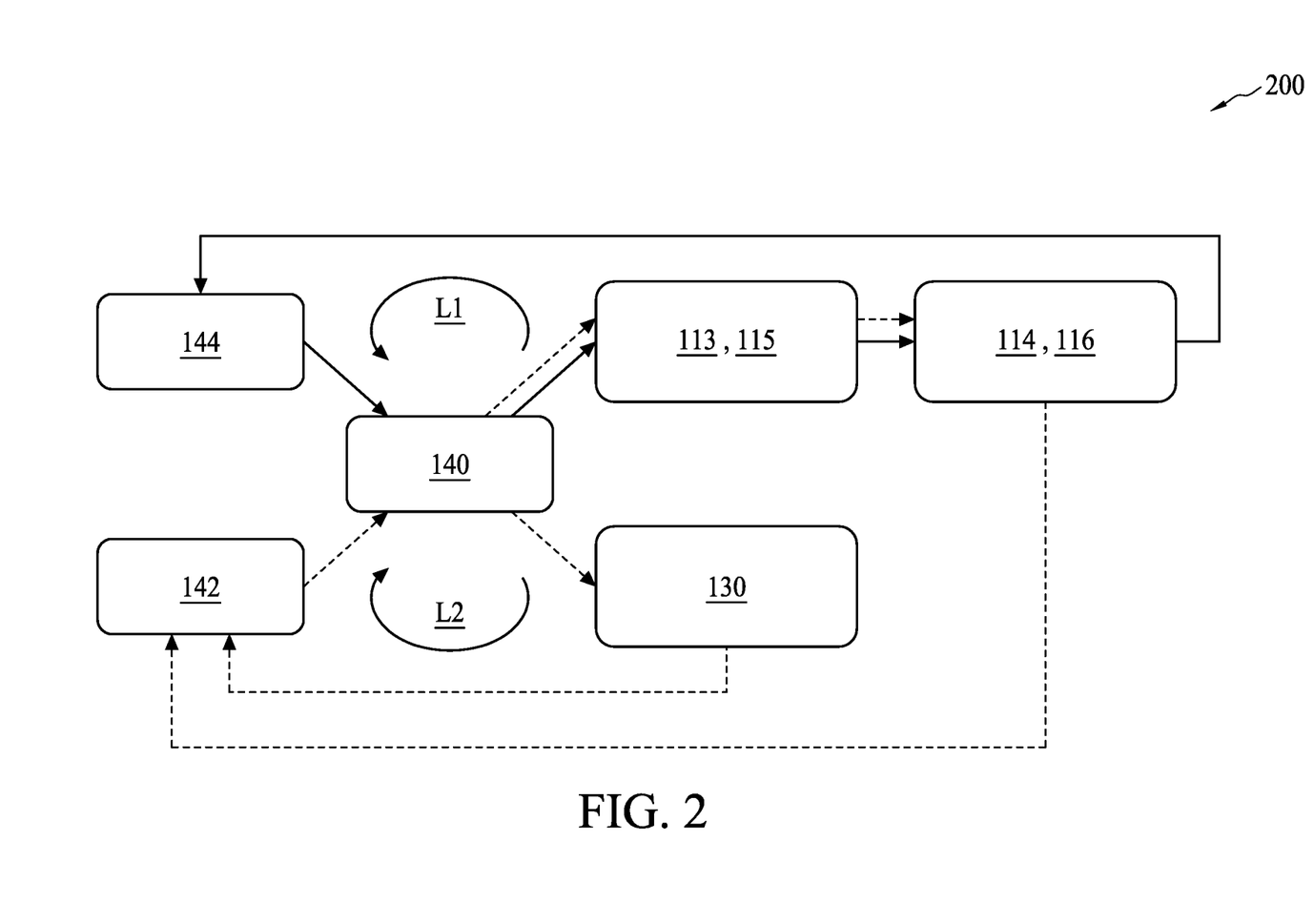
FIG. 2 is a block diagram showing a temperature and gas pressure control mechanism in an annealing operation, in accordance with some embodiments of the present disclosure.

FIG. 2 is a block diagram 200 showing a temperature and gas pressure control mechanism in an annealing operation, in accordance with some embodiments of the present disclosure. Referring to FIG. 1 and FIG. 2, the block diagram 200 depicts that the controller 140 is electrically connected to the temperature sensors 142, the gas pressure sensors 144, the valves 113, 115, 123, 125 and the heating elements 130. The valves 113, 115, 123 and 125 are further connected to the gas inlets 114, 124 and the gas vents 116, 126 for controlling gas flow into and out of the outer chamber 110 or the inner chamber 120. In some embodiments, the controller 140 serves as the data collection center and data processing unit for receiving and processing sensor data retrieved from the temperature sensors 142 and the gas pressure sensors 144. In some embodiments, the controller 140 is configured to determine adjustment levels of the heating elements 130 or the valves 113, 115, 123 and 125 (or their corresponding MFCs) and send adjustment commands to the valves 113, 115, 123, 125 and the heating elements 130 to adjust gas pressures P1 and P2 and the temperatures of each zone Z1-Z3.

The adjustment on the temperature and gas pressures P1 and P2 are performed iteratively through one or more feedback loops. In some embodiments, a first feedback loop L1 in the control mechanism is used to control the gas pressure P1 or P2. The first feedback loop L1 is formed by the controller 140, the gas pressure sensors 144, the valves 113, 115, 123, 125, the gas inlets 114, 124 and the gas vents 116, 126 in which the elements in the first feedback loop L1 are interconnected by solid lines. In some embodiments, a second feedback loop L2 in the control mechanism is used to control the temperatures of the inner chamber 120. The second feedback loop L2 is formed by the controller 140, the temperature sensors 142, the valves 113, 115, the gas inlet 114, the gas vent 116 and the heating elements 130, in which the elements in the second feedback loop L2 are interconnected by dashed lines.

Figure 3A:
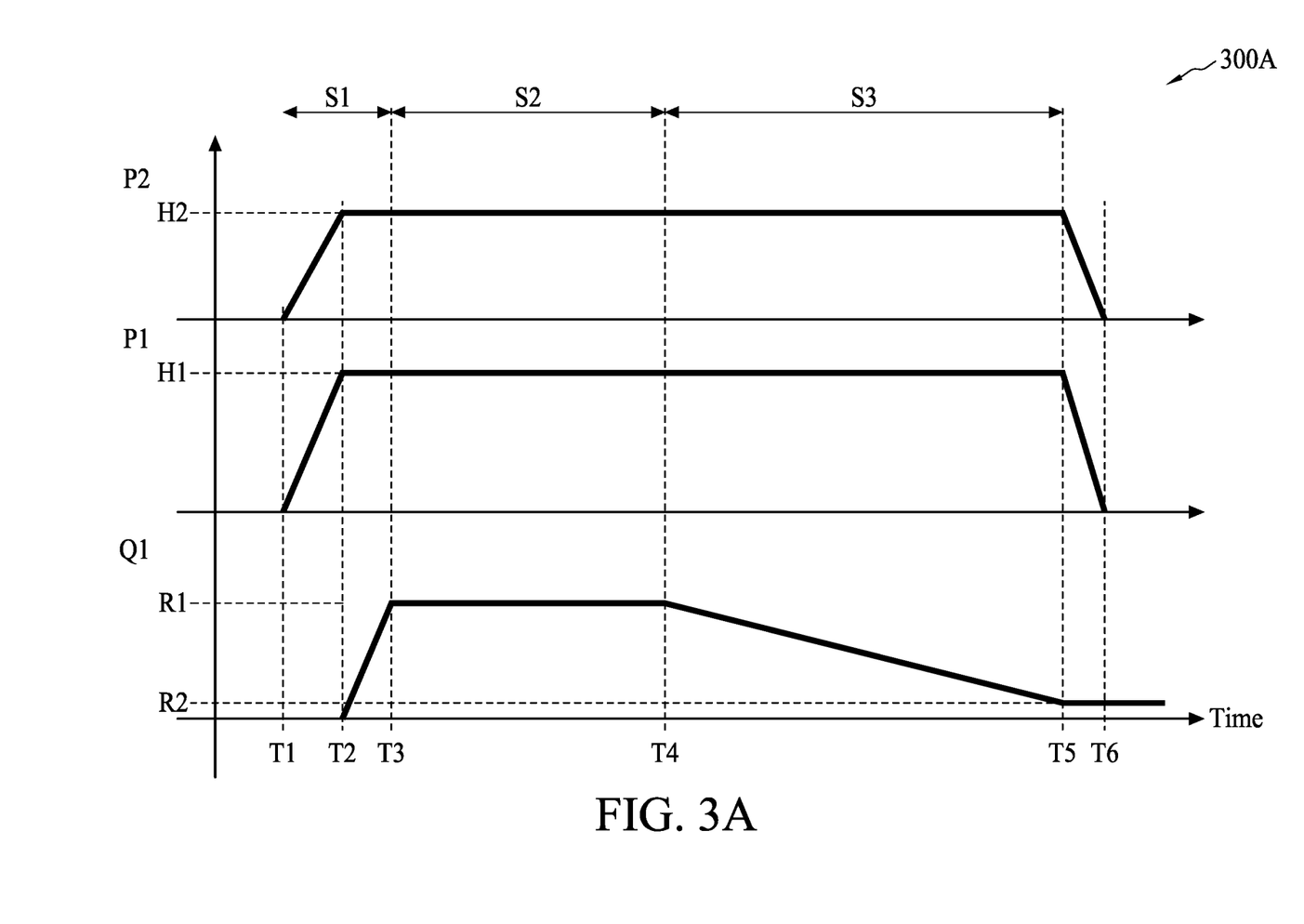
FIG. 3A is a schematic chart showing the temperature and gas pressures of an annealing apparatus during an annealing operation, in accordance with various embodiments of the present disclosure.

FIG. 3A is a schematic chart 300A showing the temperature and gas pressures of an annealing apparatus during an annealing operation, in accordance with various embodiments of the present disclosure. The x-axis of the chart 300A represents the processing time of the annealing operation and the y-axis of the chart 300A represents the temperature Q1 of the inner chamber 120, the gas pressure P2 of the inner chamber 120 and the gas pressure P1 of the outer chamber 110. The annealing operation may include a preheating stage S1, a heating stage S2, and a cooling stage S3. The preheating stage S1 may last from a time at or prior to time T1 to time T3, The heating stage S2 may last from time T3 to time T4, and the cooling stage S3 may last from time T4 to time T6. The temperatures of the inner chamber 120 and gas pressures P1 and P2 are controlled using the control mechanism as shown in FIG. 2.

During the preheating stage S1, once the wafers 152 to be processed are transported to the inner chamber 120 at or prior to time T1, the inner chamber 120 and the outer chamber 110 are configured to receive the process gas and the buffer gas, respectively, at a low temperature level, e.g., at room temperature, in a time period between time T1 and time T2. At time T2, the gas pressure P2 and gas pressure P1 may reach a stable gas pressure levels H1 and H2, respectively, in which the gas pressure difference Pd is kept below the tolerance level, e.g., 1 atm, at all times. In some embodiments, the gas pressure levels H1 and H2 are in a range between about 0 psi and about 600 psi in terms of gauge pressure. During the gas introduction period, the valve 123 is opened while the valve 125 is closed to allow the process gas to flow into the inner chamber 120, e.g., through the commands by of the controller 140, as illustrated in the first feedback loop L1 of the control mechanism shown in FIG. 2. Similarly, the valves 113 are opened while the valves 115 are closed to allow the buffer gas to flow into the outer chamber 110, e.g., through the commands by the controller 140.

In some embodiments, during the preheating stage S1 the heating elements 130 are turned on to heat the inner chamber 120 to a predetermined temperature level R1 from time T2 to time T3, e.g., through the commands by the controller 140, as illustrated in the second feedback loop L2 of the control mechanism shown in FIG. 2. In some embodiments, time T2 is set as time T1, and the preheating of the heating elements 130 and flowing of gas into the outer chamber 110 and the inner chamber 120 can be performed at the same time. In some embodiments, the temperature level R1 is in a range between about 150° C. and about 1100° C. dependent upon various requirements.

In some embodiments, the order of the steps of increasing the gas pressures P1 and P2 and the step of increasing the temperature Q1 may be interchanged. In other words, the gas pressures P1 and P2 can be increased to the predetermined levels H1 and H2 after the temperature Q1 is increased to the level R1. In some other embodiments, the steps of increasing the gas pressures P1 and P2 and the step of increasing the temperature Q1 are performed independently during the preheating stage S1.

During the heating stage S2, one or more wafers 152 to be processed receive a semiconductor fabrication step under a high-temperature and high-pressure condition, in which the temperature is kept at the level R1 and the gas pressures P1 and P2 of the outer chamber 110 and the inner chamber 120 is kept at the levels H1 and H2, respectively, until time T4.

During the cooling stage S3, the controller 140 is configured to conduct active temperature and pressure control of the inner chamber 120 and the outer chamber 110. In some embodiments, the decreasing rate or slope of the temperature Q1 of the inner chamber 120 are predetermined and provided to the controller 140. For example, after the semiconductor fabrication step is completed at time T4, the temperature Q1 is lowered to a predetermined temperature level R2 at time T5 before the wafers 152 are moved out of the inner chamber 120. In some embodiments, before the temperature Q1 reaches the temperature level R2, the gas pressures P2 and P1 are kept at the working gas pressures, i.e., H1 and H2, respectively prior to time T5. This is because the gas pressure H2 and the high temperature level R1 function cooperatively for the time period TA=T4−T3 to provide sufficient kinetics to drive elements, e.g., hydrogen, in the process gas to diffuse into a predetermined depth of the wafer 152. In some cases, even when the elements of the process gas have successfully diffused into the wafer 152 in the heating stage S2, the gas pressure P2 should be maintained at a sufficient high level in the cooling stage S3 before the temperature of the wafers 152 drops to a secure level at time T5 such that the diffused elements can be kept in place without diffusing around. In some embodiments, the controller 140 is configured to maintain the gas pressure H1 for maintaining the gas pressure difference Pd during the cooling stage S3 in response to the predetermined gas pressure H2 of the inner chamber 120. Accordingly, the gas pressure P1 of the outer chamber 110 is kept at the gas pressure level H1 to maintain the gas pressure difference Pd within the tolerance level.

In some embodiments, although the gas pressure P2 is kept unchanged at the pressure level H2 during the cooling stage between time T4 and time T5, the temperature of the buffer gas in the outer chamber 110 can be lowered more quickly through gas exchange of the buffer gas by introducing new buffer gas at the low temperature level into the outer chamber 110 in place of the heated buffer gas during the heating stage S2. In some embodiments, the valves 113 and 115 are tuned at substantially equal flow rates to maintain the same gas amount, i.e., an equal gas pressure level H1, of the outer chamber 110. The valves 113 and 115 can be controlled to achieve synchronous or interlocking tuning, i.e., through the first feedback loop L1 of the control mechanism shown in FIG. 2. In some embodiments, the flow rate or the total amount of gas ingress through the gas inlets 114 is substantially equal to the flow rate or the total amount of gas egress through the gas vents 116 at the time period between time T4 and time T5. The temperatures of the inner chamber 120 and the outer chamber 110 can be decreased during the cooling stage S3.

In some embodiments, each of the valves 113 and 115 in the zone Z1, Z2 or Z3 are controlled individually through the controller 140 to achieve zone-specific gas exchange. In some embodiments, the controller 140 is configured to cause gas exchange with different exchange rates or amounts in the zones Z1-Z3 at least during a time span within the period between time T5 and time T6. For example, the valves 113-1 and 115-1 function cooperatively to perform gas exchange for the zone Z1, in which the gas pressure level H1 in the zone Z1 are kept substantially unchanged through maintaining equal rates or amounts of gas ingress and gas egress for the zone Z1. Similarly, the valves 113-2 and 115-2 function cooperatively to perform gas exchange for the zone Z2, and the valves 113-3 and 115-3 function cooperatively to perform gas exchange for the zone Z3. In some embodiments, under the assumption that the decreasing rate or the slope of temperature in an upper zone, e.g., zone Z1, is lower than that in a lower zone, e.g., zone Z2, or Z3, the gas exchange rate or amount for the upper zone is made greater than that for the lower zone for achieving uniform rates or slopes of temperature decreases between different zones.

In some embodiments, since the zones Z1-Z3 are in fluid communication with each other, the gas components introduced through the gas inlets 114-1, 114-2, 114-3 for the zones Z1-Z3, respectively, may not completely stay within their original zones and may flow to adjacent zones during the gas exchange process. Although FIG. 3A shows only one straight line representative of the temperature across the entire inner chamber 120, the actual temperature variations for each of the zones Z1-Z3 may not exhibit identical straight lines but instead different wavy lines with approximate rates or slopes. This may make it difficult to perform accurate gas pressure control during the cooling stage S3 since the temperature fluctuation in different zones may be intensified due to cross-zone gas exchange. In some embodiments, the second feedback loop L2 of the control mechanism is introduced in the cooling stage S3 to perform active temperature management, in which the heating elements 130 of some zones are turned on for a short time to compensate for short-term temperature differences between the zones Z1-Z3, while the heating elements 130 of some other zones are turned off if temperature compensation is not required in these zones.

At time T5, the temperature Q1 reaches the temperature level R2. In some embodiments, the temperature level R2 is in a range between about 150° C. and 350° C. It is certain at time T5 that the elements of the diffused elements in the processed wafers 152 will not move around under the temperature level R2, and thus the gas pressures P2 can be lowered to zero. The process gas in the inner chamber 120 and the buffer gas in the outer chamber 110 are exhausted through the gas vents 126 and 116, respectively, through controlling the valves 125 and 115. In some embodiments, the valve 123 is closed while the valve 125 is opened to exhaust the process gas out of the inner chamber 120, e.g., through the commands by of the controller 140, as illustrated in the first feedback loop L1 of the control mechanism shown in FIG. 2. Similarly, the valves 113 are closed while the valves 115 are opened to exhaust the buffer gas out of the outer chamber 110, e.g., through the commands by the controller 140. During the time period between time T5 and time T6, the gas pressures P2 and P1 decreases simultaneously while maintaining the gas pressure difference Pd within the tolerance limit. The annealing operation is completed at time T6 when the process gas and the buffer gas are exhausted and the gas pressures P2 and P1 drop to zero psi.

Figure 3B:
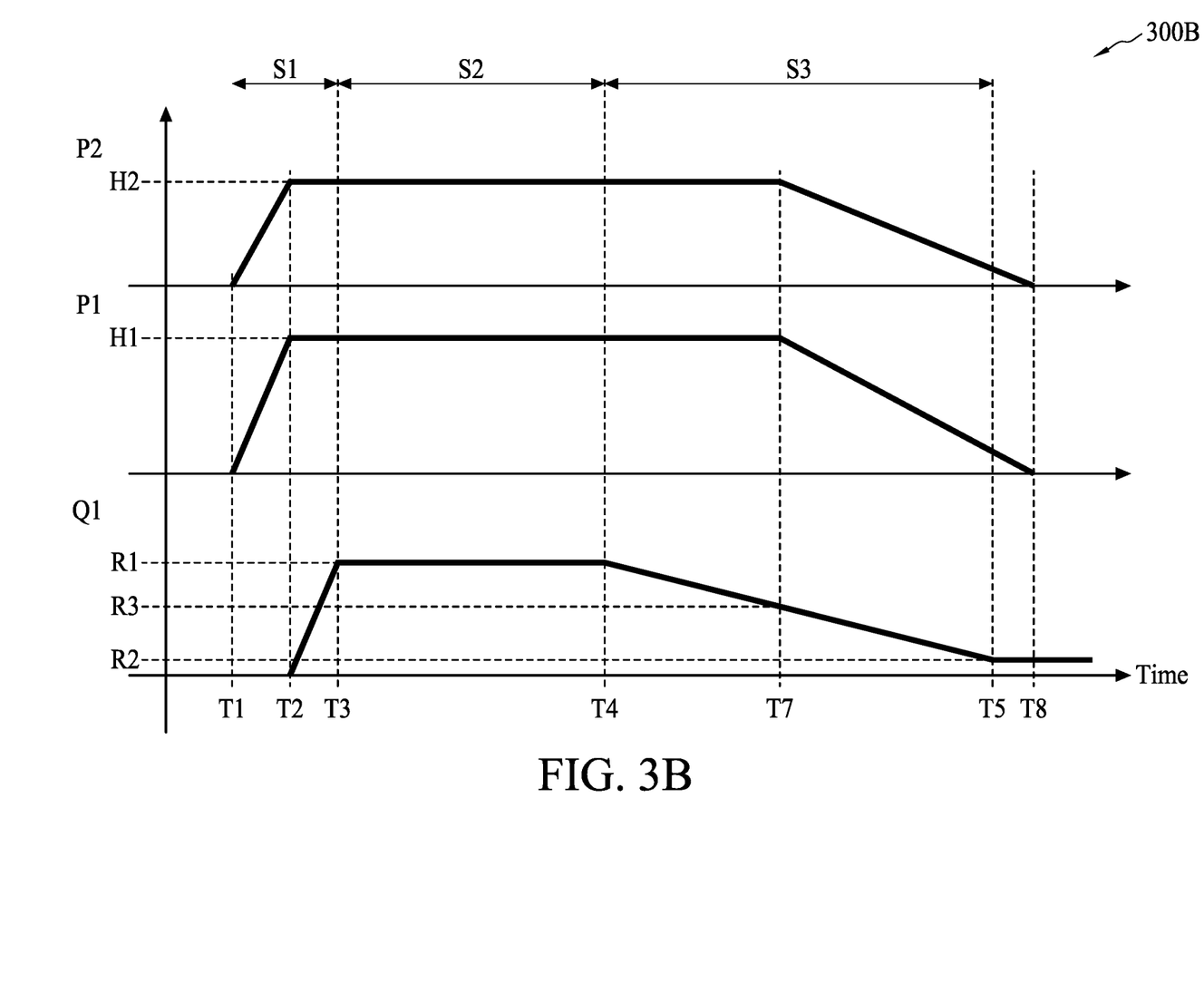
FIG. 3B is a schematic chart showing the temperature and gas pressures of an annealing apparatus during an annealing operation, in accordance with various embodiments of the present disclosure.

FIG. 3B is a schematic chart 300B showing the temperature and gas pressures of an annealing apparatus during an annealing operation, in accordance with another embodiment of the present disclosure. The temperature Q1, gas pressures P1 and P2 shown in the chart 300B are similar to those shown in FIG. 3A, and thus descriptions of similar features are not repeated for brevity. In some embodiments, the controller 140 is configured to conduct active temperature and pressure control of the inner chamber 120 and the outer chamber 110. In some embodiments, the rate or slope of the temperature Q1 of the inner chamber 120 are predetermined and provided to the controller 140. The chart 300B is different from the chart 300A in that, during the cooling stage S3, the gas pressures P1 and P2 are maintained at the highest gas pressure levels H1 and H2, respectively, only for a time period, which is shorter than the time period between time T3 and time T4, between time T4 and time T7, in which time T7 is prior to time T5. At time T7, when the temperature Q1 is lowered to a predetermined temperature level R3 higher than the temperature level R2, the gas pressures P1 and P2 start to decrease. The temperature level R3 may vary according to different applications and fabrication recipes. In some embodiments, the temperature level R3 is equal to the temperature level R1.

In some embodiments, the gas pressures P1 and P2 decreases simultaneously during the time period between time T4 and time T7 with the gas pressure difference Pd maintained within the tolerance limit. When the gas pressure P2 is decreased by exhausting the process gas of the inner chamber 120, the heat can be taken away through removal of the process gas. The temperature decrease of the inner chamber 120 can thus be made faster, thereby expediting the cooling stage S3. In some embodiments, the controller 140 is configured to adjust the rate or slope of the gas pressure H1 of the outer chamber 110 along with time for maintaining the gas pressure difference Pd during the cooling stage S3 in response to the predetermined slope of the gas pressure H2 of the inner chamber 120 along with time.

At time T5, the temperature Q1 reaches the temperature level R2. In some embodiments, the gas pressures P1 and P2 continue to decrease beyond time T5 until time T8 when the gas pressures P1 and P2 drop to zero psi.

Figure 4A:
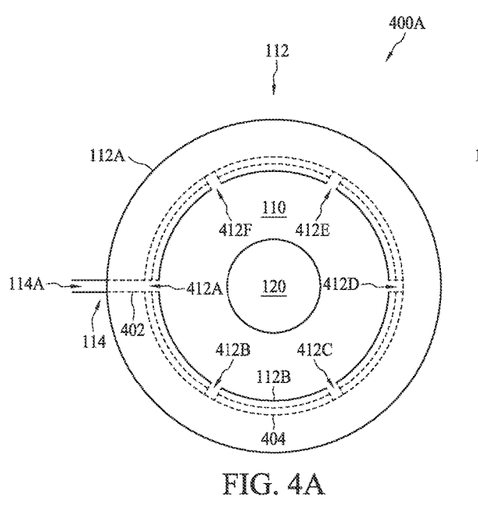
FIG. 4A shows a plan view of a gas inlet structure, in accordance with some embodiments of the present disclosure.

FIG. 4A shows a plan view 400A of a gas inlet structure 114, in accordance with some embodiments of the present disclosure. Some of the features of the annealing apparatus 100 are not illustrated in FIG. 4A for clarity. The gas inlet structure 114 may be any one of the gas inlets 114-1, 114-2 and 114-3 of the annealing apparatus 100 shown in FIG. 1. The gas inlet structure 114 is formed on the outer chamber wall 112. Referring to FIG. 4A, the gas inlet structure 114 includes a main pipe 402 and a circular pipe 404 connected to the main pipe 402. The main pipe 402 extends through the thickness of the outer chamber wall 112 and has an opening 114A on an outer sidewall 112A and an opening 412A on an inner sidewall 112B of the outer chamber wall 112, wherein the opening 114A may be connected to a gas canister or a gas pump for introduction of the buffer gas, and the opening 412A allows the buffer gas to flow into the outer chamber 110. The circular pipe 404 may be in a circular shape and in fluid communication with the main pipe 402 to supply the buffer gas to the outer chamber 110 through more channels. The circular pipe 404 may extend in a circular manner within the outer chamber wall 112. In some embodiments, the circular pipe 404 has at least one openings 412B, 412C, 412D, 412E and 412F formed on the inner sidewall 112B. In some embodiments, the openings 412A-412F are arranged in a symmetrical manner to distribute the buffer gas more efficiently and uniformly across the horizontal plane in each zone Z1-Z3. In the depicted example, the circular pipe 404 includes five openings. However, the present disclosure is not limited thereto, and other numbers of the openings of the circular pipe 404 are also within the contemplated scoped of the present disclosure.

Figure 4B:
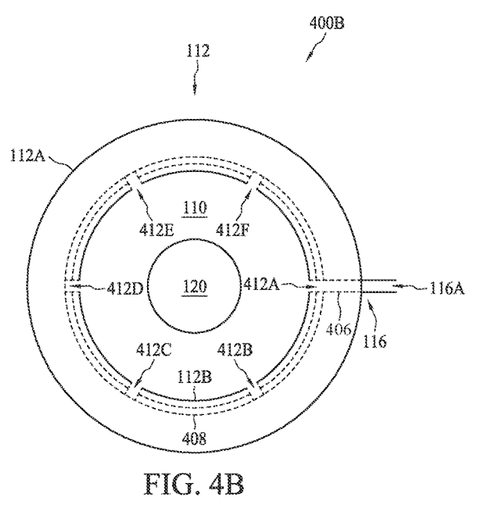
FIG. 4B shows a plan view of a gas vent structure, in accordance with some embodiments of the present disclosure.

FIG. 4B shows a plan view 400B of a gas vent structure 116, in accordance with some embodiments of the present disclosure. Some of the features of the annealing apparatus 100 are not illustrated in FIG. 4B for clarity. The gas vent structure 116 may be any one of the gas vents 116-1, 116-2 and 116-3 of the annealing apparatus 100 shown in FIG. 1. The gas vent structure 116 is formed on the outer chamber wall 112. Referring to FIG. 4B, the gas vent structure 116 includes a main pipe 406 and a circular pipe 408 connected to the main pipe 406. The main pipe 406 extends through the thickness of the outer chamber wall 112 and has an opening 116A on the outer sidewall 112A and an opening 414A on the inner sidewall 112B, wherein the opening 116A may be connected to a gas tank for collection of the exhausted buffer gas, and the opening 414A allows the buffer gas to flow out of the outer chamber 110. The circular pipe 408 may be in a circular shape and in fluid communication with the main pipe 406 to exhaust the buffer gas from the outer chamber 110 through more channels. The circular pipe 408 may extend in a circular manner within the outer chamber wall 112. In some embodiments, the circular pipe 408 has at least one openings 414B, 414C, 414D, 414E and 414F formed on the inner sidewall 112B. In some embodiments, the openings 414A-414F are arranged in a symmetrical manner to exhaust the buffer gas more efficiently and uniformly across the horizontal plane in each zone Z1-Z3. In the depicted example, the circular pipe 408 includes five openings. However, the present disclosure is not limited thereto, and other numbers of the openings of the circular pipe 408 are also within the contemplated scoped of the present disclosure.

Referring to FIG. 4A and FIG. 4B, the main pipes 402 and 406 may be in the opposite orientations as shown in the gas inlet structure 114 and the gas vent structure 116. In some embodiments, the main pipes 402 and 406 may be in the same orientations. The gas inlet structure 114 and the gas vent structure 116 may be arranged in a stack vertically in the outer chamber wall 112.

Figure 5:
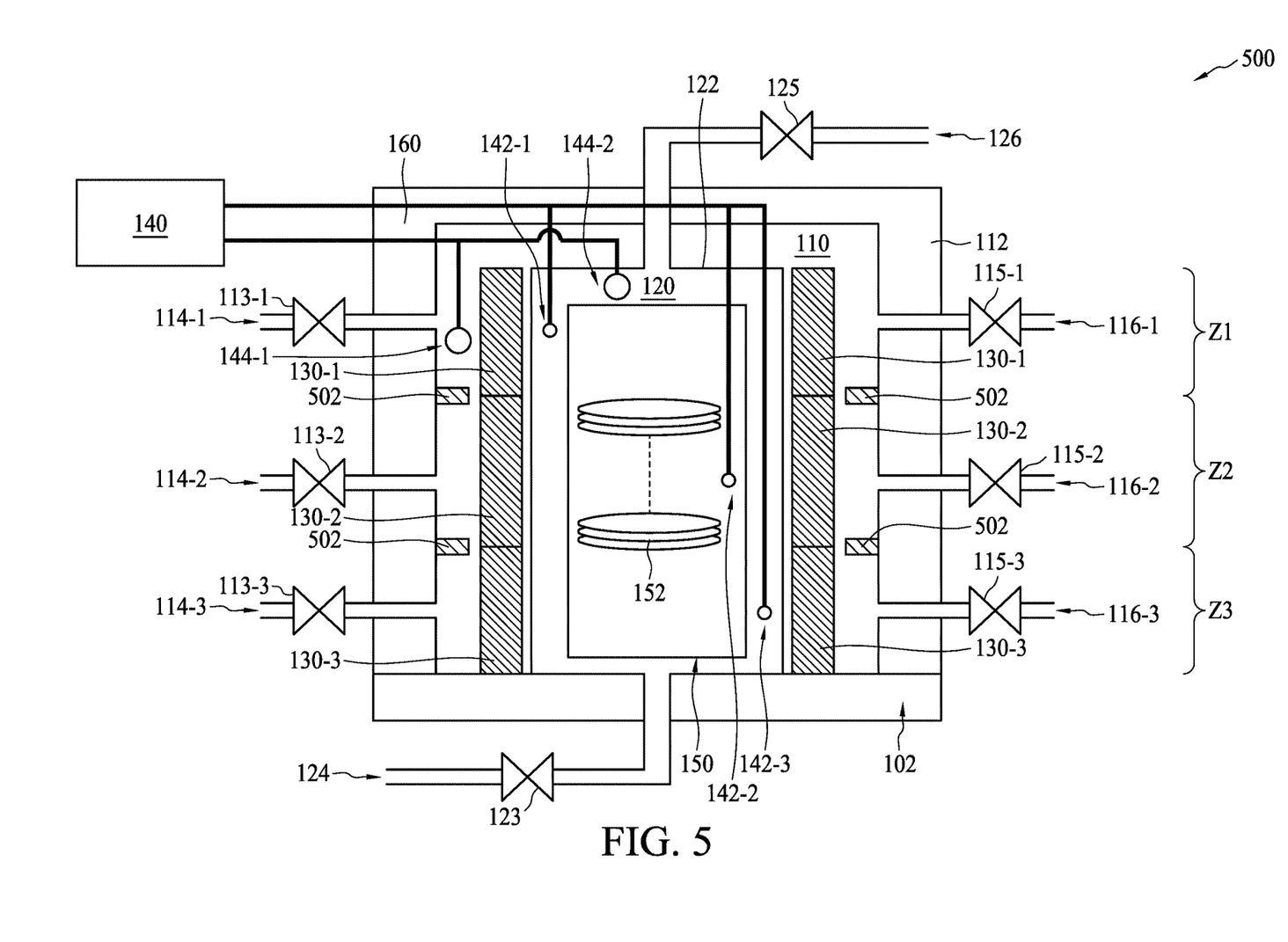
FIG. 5 is a schematic diagram of an annealing apparatus, in accordance with some embodiments of the present disclosure.

FIG. 5 is a schematic diagram of an annealing apparatus 500, in accordance with some embodiments of the present disclosure. The annealing apparatus 500 is similar to the annealing apparatus 100 in many aspects, and descriptions of similar features are not repeated for brevity. Some features of the annealing apparatus 100, which are also included in the annealing apparatus 500, are not illustrated in FIG. 5 for clarity. Referring to FIG. 1 and FIG. 5, the annealing apparatus 500 further includes one or more baffles 502 between adjacent zones Z1-Z3. In some embodiments, the baffles 502 extend horizontally from the outer chamber wall 112 toward the inner chamber wall 122. In some embodiments, the baffles 502 are fixed on the outer chamber wall 112. In some other examples, although not shown, the baffles 502 are fixed on the inner chamber wall 122 and extending horizontally from the inner chamber wall 122 toward the outer chamber wall 112. In some embodiments, the baffles 502 define the boundaries of the zones Z1-Z3. Although the baffles 502 separate the adjacent zones Z1-Z3, gaps may be left between the baffles 502 and the inner chamber wall 122 to allow gas to flow freely across adjacent zone Z1-Z3. In some embodiments, the baffles 502 may be formed of materials similar to the outer chamber wall 112 or the inner chamber wall 122. The baffles 502 may aid in heat conduction and gas exchange control during the cooling stage S3 of the annealing operation.

Figure 6:
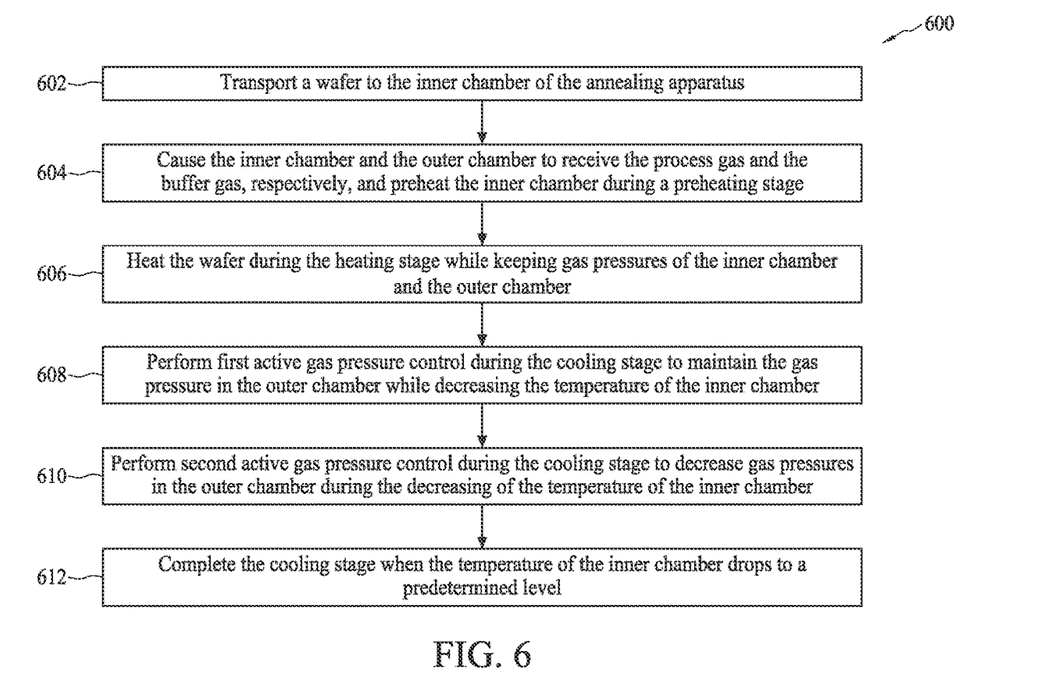
FIG. 6 is a flowchart of an annealing method, in accordance with some embodiments.

FIG. 6 is a flowchart of an annealing method 600, in accordance with some embodiments. It should be understood that additional steps can be provided before, during, and after the steps of the method 600, and some of the steps described below can be replaced or eliminated, for additional embodiments of the method. The order of the steps may be changed. Materials, configurations, dimensions, processes and/or operations the same as or similar to those described with respect to the foregoing embodiments may be employed in the following embodiments, and the detailed explanation thereof may be omitted.

At step 602, a wafer is transported to the inner chamber of the annealing apparatus during a preheating stage of the annealing operation. The annealing apparatus may be the annealing apparatus 100 or 500. In some embodiments, the annealing apparatus includes a dual-chamber structure including an inner chamber and an outer chamber.

At step 604, the inner chamber and the outer chamber are caused to receive the process gas and the buffer gas, respectively, and the inner chamber is preheated during the preheating stage.

At step 606, the wafer is heated during the heating stage for performing a specified semiconductor fabrication step. The gas pressures of the inner chamber and the outer chamber are kept unchanged during the heating stage.

At step 608, after the semiconductor fabrication step is completed, a first active gas pressure control is performed during the cooling stage to maintain the gas pressure in the outer chamber while decreasing the temperature of the inner chamber. The first active gas pressure control may be performed for a time period of a portion or an entirety of the cooling operation.

At step 610, in some embodiments, a second active gas pressure control is performed during the cooling stage to decrease gas pressures in the outer chamber during the decreasing of the temperature of the inner chamber.

At step 612, the cooling stage is completed when the temperature of the inner chamber drops to a predetermined level.

According to an embodiment, a method includes: transporting a wafer to an apparatus, the apparatus including: a first chamber configured to receive the wafer and a first gas; a second chamber surrounding the first chamber and configured to receive a second gas; a plurality of gas inlets on a chamber wall of the second chamber; and a plurality of gas vents on the chamber wall of the second chamber; heating the first chamber while keeping a gas pressure difference between the first chamber and the second chamber within a tolerance limit; and cooling the first chamber by exchanging the second gas in the second chamber while keeping the gas pressure difference within the tolerance limit.

According to an embodiment, a method of operating an apparatus is discussed. A wafer is transported to the apparatus, where the apparatus includes a first chamber configured to receive the wafer, a second chamber surrounding the first chamber and configured to receive a first gas, a first gas inlet and a first gas vent on a chamber wall of the second chamber, and a second gas inlet and a second gas vent arranged on the chamber wall of the second chamber over the first gas inlet and the first gas vent. The first chamber is heated for a first period while keeping a first gas pressure of the second chamber. After the first period, the first chamber is cooled for a second period by performing exchange of the first gas in the second chamber while keeping the first gas pressure.

According to an embodiment, an apparatus includes a first chamber configured to receive a first gas for performing an annealing operation, a second chamber surrounding the first chamber and configured to receive a second gas, a plurality of heating elements configured to heat the first chamber, a first gas inlet and a first gas vent arranged on opposite sides of a chamber wall of the second chamber, a second gas inlet and a second gas vent arranged on opposite sides of the chamber wall, and a controller configured to control a gas pressure of the second gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    transporting a wafer to an apparatus, the apparatus comprising:
        a first chamber configured to receive the wafer and a first gas;
        a second chamber surrounding the first chamber and configured to receive a second gas;
        a plurality of gas inlets on a chamber wall of the second chamber; and
        a plurality of gas vents on the chamber wall of the second chamber;
    heating the first chamber while keeping a gas pressure difference between the first chamber and the second chamber within a tolerance limit; and
    cooling the first chamber by exchanging the second gas in the second chamber while keeping the gas pressure difference within the tolerance limit, wherein
    the exchanging of the second gas includes introducing a first amount of the second gas to the second chamber through the plurality of gas inlets and exhausting a second amount of the second gas out of the second chamber through the plurality of gas vents, and
    during the cooling, a first gas pressure of the first chamber and a second gas pressure of the second chamber are maintained substantially constant for a first period with the gas pressure difference kept within the tolerance limit, wherein during the cooling of the first chamber, the first gas pressure and the second gas pressure are simultaneously decreased while the gas pressure difference is kept within the tolerance limit for a second period after the first period.

2. The method according to claim 1, wherein the plurality of gas inlets form pairs with the plurality of gas vents.

3. The method according to claim 2, wherein the cooling of the first chamber by exchanging the second gas in the second chamber comprises causing different exchange amounts of the second gas for the pairs of the plurality of gas inlets and the plurality of gas vents during the cooling.

4. The method according to claim 1, wherein the plurality of gas inlets or the plurality of gas vents are arranged at different heights of the chamber wall.

5. The method according to claim 1, wherein the apparatus further comprises a plurality of heating elements laterally surround the first chamber, wherein the heating of the first chamber comprises heating the first chamber by activating the plurality of heating elements.

6. The method according to claim 5, wherein the plurality of heating elements are arranged at different heights of the first chamber.

7. The method according to claim 6, wherein the second chamber defines a plurality of zones corresponding to the plurality of heating elements, wherein the method further comprises individually measuring temperatures of the plurality of zones.

8. The method according to claim 7, wherein the cooling of the first chamber comprises tuning each of the plurality of heating elements individually according to temperature measurements of the plurality of zones.

9. The method according to claim 7, wherein the cooling of the first chamber comprises causing rates of temperature decreases in the plurality of zones are substantially equal during the cooling.

10. The method according to claim 1, wherein the second period is less than first period.

11. The method according to claim 1, wherein the first gas pressure and the second gas pressure are decreased in response to a temperature of the first chamber as being below a predetermined level during the cooling.

12. The method according to claim 1, wherein the second gas comprises inert gas.

13. A method of operating an apparatus, the method comprising:
transporting a wafer to the apparatus, the apparatus comprising:
a first chamber configured to receive the wafer;
a second chamber surrounding the first chamber and configured to receive a first gas;
a first gas inlet and a first gas vent on a chamber wall of the second chamber; and
a second gas inlet and a second gas vent arranged on the chamber wall of the second chamber over the first gas inlet and the first gas vent;
heating the first chamber for a first period while keeping a gas pressure of the second chamber at a first gas pressure; and
after the first period, cooling the first chamber for a second period by performing exchange of the first gas in the second chamber through introducing a first amount of the first gas to the second chamber through the first and second gas inlets and exhausting a second amount of the first gas out of the second chamber while keeping a gas pressure difference between the first gas pressure and a second gas pressure of the first chamber within a tolerance limit, wherein during the cooling of the first chamber the second period includes:
a first duration, during which the first gas pressure and the second gas pressure are maintained to be substantially constant; and
a second duration, during which the first gas pressure and the second gas pressure are simultaneously decreased.

14. The method according to claim 13, further comprising, after the second period, cooling the first chamber for a third period while decreasing the first gas pressure.

15. The method according to claim 13, wherein the performing of exchange of the first gas in the second chamber comprises causing different exchange amounts of the first gas in different zones of the second chamber during the second period.

16. The method according to claim 13, wherein,
the first gas inlet and the first gas vent are in a first zone of the second chamber,
the second gas inlet and the second gas vent are in a second zone of the second chamber, and
the cooling of the first chamber by flowing the first gas to the second chamber comprises causing the first zone and the second zone to have substantially equal rates of temperature decreases through controlling the first gas inlet, the first gas vent, the second gas inlet and the second gas vent individually.

17. A method, comprising:
transporting a wafer to an apparatus, the apparatus comprising
a first chamber configured to receive the wafer and a first gas; and
a second chamber surrounding the first chamber and configured to receive a second gas;
during a first period, increasing gas pressures of the first chamber and the second chamber to predetermined pressures;
during a second period, heating the first chamber and keeping the gas pressures of the first chamber and the second chamber at the respective predetermined pressures;
during a third period, cooling the first chamber by exchanging the second gas in the second chamber with an exterior environment while keeping a gas pressure difference between the first chamber and the second chamber within a tolerance limit, wherein the exchanging of the second gas includes introducing a first amount of the second gas to the second chamber and exhausting a second amount of the second gas out of the second chamber while keeping the respective predetermined pressures of the first chamber and the second chamber substantially unchanged during the cooling of the first chamber; and
during a fourth period, cooling the first chamber by simultaneously decreasing the gas pressures of the first and second chambers while keeping the gas pressure difference within the tolerance limit for a time interval.

18. The method according to claim 17, wherein the apparatus further defines zones in a vertical direction of the apparatus, wherein the cooling of the first chamber while keeping the gas pressures at the respective predetermined pressures comprises reducing temperature differences across the zones.

19. The method according to claim 17, wherein during the first, second and third periods, a second gas pressure of the first chamber is less than the first gas pressure of the second chamber.

20. The method according to claim 19, wherein the second pressure is less than the first pressure by less than about 2 atm.

* * * * *